United States Patent
Li et al.

(10) Patent No.: US 9,048,795 B2
(45) Date of Patent: Jun. 2, 2015

(54) METHOD FOR IMPLEMENTING COMPENSATION FILTER AND APPARATUS FOR SIGNAL BANDWIDTH COMPENSATION

(71) Applicant: HUAWEI TECHNOLOGIES CO., LTD., Shenzhen (CN)

(72) Inventors: Jun Li, Chengdu (CN); Xianfeng Li, Chengdu (CN); Yanzhao Pang, Chengdu (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 14/198,919

(22) Filed: Mar. 6, 2014

(65) Prior Publication Data

US 2014/0184327 A1 Jul. 3, 2014

Related U.S. Application Data

(63) Continuation of application No. PCT/CN2013/080501, filed on Jul. 31, 2013.

(30) Foreign Application Priority Data

Dec. 3, 2012 (CN) .......................... 2012 1 0508814

(51) Int. Cl.
H04K 1/02 (2006.01)
H03F 1/32 (2006.01)

(52) U.S. Cl.
CPC ............ *H03F 1/3241* (2013.01); *H03F 1/3247* (2013.01); *H03F 1/3294* (2013.01); *H03F 2200/336* (2013.01)

(58) Field of Classification Search
None
See application file for complete search history.

(56) References Cited

U.S. PATENT DOCUMENTS 6,141,390 A * 10/2000 Cova .............................. 375/297
7,688,138 B2 * 3/2010 Hehn ............................ 330/149

(Continued)

FOREIGN PATENT DOCUMENTS

CN 101706522 5/2010
CN 102511153 6/2012

(Continued)

OTHER PUBLICATIONS

International Search Report mailed Oct. 10, 2013 in corresponding International Patent Application No. PCT/CN2013/080501.

*Primary Examiner* — Adolf Dsouza
(74) *Attorney, Agent, or Firm* — Staas & Halsey LLP (57) ABSTRACT

An apparatus for signal bandwidth compensation is disclosed. The apparatus includes: a digital predistortion filtering unit, a compensation filter, a conversion unit, and a power amplifier; where the digital predistortion filtering unit receives an original signal, performs predistortion processing on the original signal; the compensation filter receives the predistortion signal, compensates for distortion caused during a process of transmitting the predistortion signal to the power amplifier, and outputs a compensated predistortion signal to the conversion unit; the conversion unit receives the compensated predistortion signal, converts the compensated predistortion signal into an analog signal, performs frequency mixing processing, and outputs a predistortion signal experiencing the frequency mixing to the power amplifier; the power amplifier receives the predistortion signal experiencing the frequency mixing, amplifies the predistortion signal experiencing the frequency mixing, and outputs an amplified signal.

8 Claims, 3 Drawing Sheets

(56) References Cited

U.S. PATENT DOCUMENTS

2010/0183091 A1 7/2010 Wang et al.
2010/0330929 A1* 12/2010 Heutmaker et al. ............ 455/73
2013/0287390 A1 10/2013 Abe et al.

FOREIGN PATENT DOCUMENTS

| CN | 102694760 | 9/2012 |
| WO | 2012/029613 A1 | 3/2012 |

* cited by examiner

METHOD FOR IMPLEMENTING COMPENSATION FILTER AND APPARATUS FOR SIGNAL BANDWIDTH COMPENSATION

CROSS-REFERENCE TO RELATED APPLICATIONS

This application is a continuation of International Application No. PCT/CN2013/080501, filed on Jul. 31, 2013, which claims priority to Chinese Patent Application No. 201210508814.7, filed on Dec. 3, 2012, both of which are hereby incorporated by reference in their entireties.

TECHNICAL FIELD

Embodiments of the present invention relate to the communications field, and in particular, to a method for implementing a compensation filter and an apparatus for signal bandwidth compensation.

BACKGROUND

In a communication network in a practical application, a filter feature of a communication device has a rated bandwidth, and a signal exceeding the rated bandwidth is not processed. This attenuates a useful signal and affects normal transmission of a signal. For an analog device, this problem is especially more common. In the prior art, no device can solve such problem.

SUMMARY

A major technical problem to be solved by embodiments of the present invention is to provide a method for implementing a compensation filter, and an apparatus for signal bandwidth compensation, so as to solve a problem of lacking a compensation device in the prior art.

Embodiments of the present invention employ the following technical solutions:

In a first aspect, a method for implementing a compensation filter is provided, including: obtaining a first parameter matrix with the least number of columns according to a target performance index, where an order of the first parameter matrix is $2M+1$; determining an order of a parameter matrix of the compensation filter as $2N+1$; performing a convolution operation on a parameter matrix of a filter feature of an apparatus to be compensated, so as to obtain a transformation matrix with an order being $2M+2N+1$; transforming the transformation matrix into a second parameter matrix with $2N+1$ columns and $2M+1$ rows; and calculating a parameter of the compensation filter by using the following formula:

$$w=(x'x)^{-1}x'q;$$

where w denotes the parameter matrix of the compensation filter, and $w=[w_{-N}, w_{-N+1}, \ldots, w_N]^T$; q denotes the first parameter matrix, and $q=[q_{-M}, q_{-M+1}, \ldots, q_M]^T$; x denotes the second parameter matrix, and $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots \\ x_{M-N}, & x_{M-N+1}, & \ldots, & x_{M+N}, \end{bmatrix};$$

and x' denotes a conjugate transpose matrix of x.

In combination with implementation of the first aspect, in first possible implementation of the first aspect, the transforming the transformation matrix into a second parameter matrix with $2N+1$ columns and $2M+1$ rows specifically includes: taking $2N+1$ elements starting from the i th element in the transformation matrix as the i th row of the second parameter matrix, where $0<i<=2M+1$, and i is a positive integer.

In combination with implementation of the first aspect or the first possible implementation of the first aspect, in second possible implementation of the first aspect, the performing a convolution operation on a parameter matrix of a filter feature of an apparatus to be compensated, so as to obtain a transformation matrix with an order being $2M+2N+1$ specifically includes: if the order of the matrix that is obtained by performing the convolution operation on the parameter matrix of the filter feature of the apparatus to be compensated is greater than $2M+2N+1$, removing a same number of columns from two ends to obtain the transformation matrix with the order being $2M+2N+1$; and if the order of the matrix that is obtained by performing the convolution operation on the parameter matrix of the filter feature of the apparatus to be compensated is less than $2M+2N+1$, adding a same number of columns of zeros at two ends to obtain the transformation matrix with the order being $2M+2N+1$.

In a second aspect, an apparatus for signal bandwidth compensation is provided, including: a digital predistortion filtering unit, a compensation filter, a conversion unit, and a power amplifier; where the digital predistortion filtering unit is configured to receive an original signal, perform predistortion processing on the original signal, and output a predistortion signal to the compensation filter; the compensation filter is configured to receive the predistortion signal from the digital predistortion filtering unit, compensate for distortion caused during a process of transmitting the predistortion signal to the power amplifier, and output a compensated predistortion signal to the conversion unit; the conversion unit is configured to receive the compensated predistortion signal from the compensation filter, convert the compensated predistortion signal into an analog signal, perform frequency mixing processing, and output a predistortion signal experiencing the frequency mixing to the power amplifier; and the power amplifier is configured to receive the predistortion signal experiencing the frequency mixing from the conversion unit, amplify the predistortion signal experiencing the frequency mixing, and output an amplified signal;

where a parameter of the compensation filter is obtained by using the following formula:

$$w=(x'x)^{-1}x'q;$$

where, w is a parameter matrix of the compensation filter, $w=[w_{-N}, w_{-N+1}, \ldots, w_N]^T$, and an order of w is $2N+1$; q is a first parameter matrix, $q=[q_{-M}, q_{-M+1}, \ldots, q_M]^T$, and an order of q is $2M+1$; the first parameter matrix is a parameter matrix with the least number of columns that is obtained according to a target performance index; x is a second parameter matrix, and $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots \\ x_{M-N}, & x_{M-N+1}, & \ldots, & x_{M+N}, \end{bmatrix};$$

the second parameter matrix is obtained by transformation by a transformation matrix; the transformation matrix is a matrix obtained by performing a convolution operation according to a parameter matrix of a filter feature of a device in the conversion unit, and an order of the transformation matrix is 2M+2N+1; and x' is a conjugate transpose matrix of x.

In combination with implementation of the second aspect, in first possible implementation of the second aspect, that the second parameter matrix is obtained by transformation by a transformation matrix specifically includes: taking 2N+1 elements starting from the i th element in the transformation matrix to form the i th row of the second parameter matrix, where 0<i<=2M+1, and i is a positive integer.

In combination with implementation of the second aspect or the first possible implementation of the second aspect, in second possible implementation of the second aspect, that the transformation matrix is obtained by performing a convolution operation on a parameter matrix of a filter feature of a device in the conversion unit, and an order of the transformation matrix is 2M+2N+1 specifically includes: if the order of the matrix that is obtained by performing the convolution operation on the parameter matrix of the filter feature of the apparatus to be compensated is greater than 2M+2N+1, removing a same number of columns from two ends to obtain the transformation matrix with the order being 2M+2N+1; and if the order of the matrix that is obtained by performing the convolution operation on the parameter matrix of the filter feature of the apparatus to be compensated is less than 2M+2N+1, adding a same number of columns of zeros at two ends to obtain the transformation matrix with the order being 2M+2N+1.

In combination with implementation of the second aspect, the first possible implementation of the second aspect, or the second possible implementation of the second aspect, in third possible implementation of the second aspect, the target performance index includes the following: a bandwidth of the predistortion signal experiencing the frequency mixing is greater than or equal to three times a bandwidth of an amplified signal, a signal amplitude fluctuation within a passband of a filter formed by the compensation filter and the conversion unit is less than or equal to 1 dB, and a group delay fluctuation of a filter formed by the compensation filter and the conversion unit is less than or equal to 5 ns.

In combination with the third possible implementation of the second aspect, in fourth possible implementation of the second aspect, the target performance index further includes the following: a difference between a stopband attenuation of the filter formed by the compensation filter and the conversion unit and a passband attenuation is greater than or equal to 20 dB.

The method for implementing a compensation filter according to the embodiments of the present invention solves a problem of lacking a compensation device in the prior art. A useful signal that is attenuated due to an excess of a rated bandwidth of a device is compensated by using the compensation filter. This ensures normal transmission of a signal.

DESCRIPTION OF EMBODIMENTS

Figure 1:
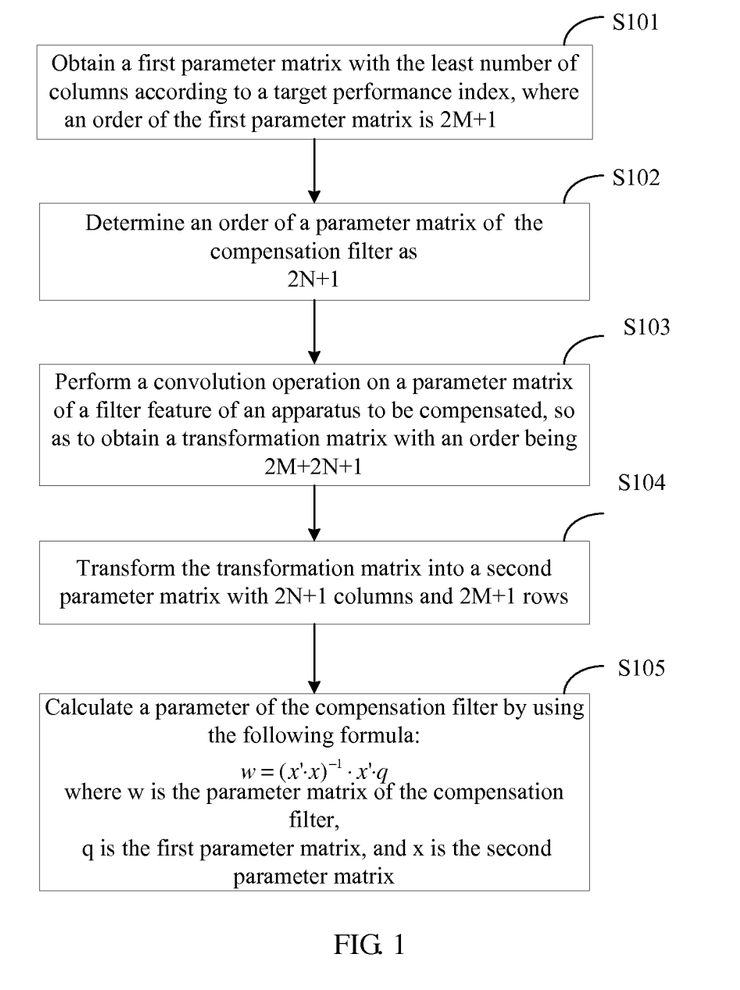
FIG. 1 is a flowchart of a first embodiment illustrating a method for implementing a compensation filter according to the present invention.

Refer to FIG. 1. FIG. 1 is a flowchart of a first embodiment illustrating a method for implementing a compensation filter according to the present invention. As shown in FIG. 1, the method for implementing a compensation filter includes:

Step S101: Obtain a first parameter matrix with the least number of columns according to a target performance index, where an order of the first parameter matrix is 2M+1.

The target performance index refers to a performance index that needs to reach after a compensation filter compensates for an apparatus to be compensated. The target performance index may be determined according to actual requirements.

After the target performance index is determined, a first parameter matrix may be obtained according to the target performance index. In this embodiment, the first parameter matrix may be directly generated by using software such as MATLAB or other tools. The order of the first parameter matrix is determined mainly according to performance indexes such as a bandwidth, in-band flatness, group delay, and out-band and in-band attenuation. For example, if it is required that the in-band flatness be less than 1 dB, the matrix needs 20 orders; if it is required that the in-band flatness be less than 3 dB, the matrix needs only 10 orders.

Step S102: Determine an order of a parameter matrix of the compensation filter as 2N+1.

The higher the order of the parameter matrix of the compensation filter, the better the compensation effect, but also the higher the hardware cost. In a practical application, within a permitted range of the cost, maximize the order of the parameter matrix of the compensation filter.

Step S103: Perform a convolution operation on a parameter matrix of a filter feature of an apparatus to be compensated, so as to obtain a transformation matrix with an order being 2M+2N+1.

The parameter matrix of the filter feature of the apparatus to be compensated may be obtained by performing vector scanning on various devices in the apparatus to be compensated, or may be obtained from device material provided by a vendor. After the parameter matrix of the filter feature of the apparatus to be compensated is obtained, the convolution operation is performed on the parameter matrix to obtain the transformation matrix with the order being 2M+2N+1.

Step S104: Transform the transformation matrix into a second parameter matrix with 2N+1 columns and 2M+1 rows.

Step S105: Calculate a parameter of the compensation filter by using the following formula:

$$w=(x'x)^{-1} \cdot x'q; \quad (1)$$

where w denotes the parameter matrix of the compensation filter, and $w=[w_{-N}, w_{-N+1}, \ldots, w_N]^T$; q denotes the first parameter matrix, and $q=[q_{-m}, q_{-M+1}, \ldots, q_M]^T$; x denotes the second parameter matrix, and $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots & & & \\ x_{M-N}, & x_{M-N+1}, & \ldots, & x_{M+N}, \end{bmatrix};$$

and x' denotes a conjugate transpose matrix of x.

The formula $w=q\cdot x'\cdot(x\cdot x')^{-1}$ for calculating the parameter of the compensation filter is deduced using the following method:

The compensation filter is arranged before the apparatus to be compensated, and a combination of a filter feature of the compensation filter and the filter feature of the apparatus to be compensated is equivalent to a filter feature of a target filter. If the filter feature of the compensation filter, the apparatus to be compensated, and the target filter are all denoted by a frequency domain:

$$Q=Y\cdot W; \quad (2)$$

where Q is a parameter of the target filter in the frequency domain; Y is a parameter, in the frequency domain, of the apparatus to be compensated; and W is a parameter of the compensation filter in the frequency domain.

After being converted into a time frequency, the product of the frequency domain may be denoted in the form of convolution:

$$q_m = \sum_{n=-\infty}^{\infty} y_{m-n} w_n, \quad (3)$$

where the value of $m$ ranges from $-\infty$ to $\infty$;

where q is a parameter matrix of the target filter in the time frequency domain; y is a parameter matrix, in the time frequency domain, of the apparatus to be compensated; and w is a parameter matrix of the compensation filter in the time frequency domain.

Assume that an order of the parameter matrix w of the compensation filter is n=2N+1, the value of n ranges from –N to N, an order of the parameter matrix q of the target filter is m=2M+1, and the value of m ranges from –M to M. Then an order of the parameter matrix y of the apparatus to be compensated is 2M+2N+1, and the value of the order ranges from M–M–N to M+N. Formula (3) may be simplified as follows:

$$q_m = \sum_{n=-N}^{\infty} y_{m-n} w_n, \quad (4)$$

where the value of $m$ ranges from $-M$ to $M$.

According to a convolution operation rule, the parameter matrix y of the apparatus that is to be compensated and has the order being 2M+2N+1 is transformed into an operation matrix x with 2M+1 rows and 2N+1 columns Formula (4) is transformed into:

$$q=x\cdot w \quad (5)$$

Further, formula (5) is deducted to the following:

$$x'\cdot q=x'\cdot x\cdot w$$

$$(x'\cdot x)^{-1}\cdot x'\cdot q=w;$$

A formula for calculating a parameter of the compensation filter is obtained:

$$w=(x'\cdot x)^{-1}\cdot x'\cdot q; \quad (6)$$

where q is a parameter matrix of the target filter, that is, the first parameter matrix in the foregoing embodiment; x is an operation matrix, that is, the second parameter matrix in the foregoing embodiment; w is a parameter matrix of the compensation filter, that is, the parameter matrix of the compensation filter in the foregoing embodiment; y is a parameter matrix of the apparatus to be compensated, that is, the transformation matrix in the foregoing embodiment; x' is a conjugate transpose matrix of x.

In this embodiment of the present invention, the compensation filter solves a problem of lacking a compensation device in the prior art. A useful signal that is attenuated due to an excess of a rated bandwidth of a device is compensated by using the compensation filter. This ensures normal transmission of a signal.

In another embodiment, based on step S101 to step S105 in the foregoing embodiment, further, step S103 may specifically include:

obtaining an original transformation matrix by performing a convolution operation on the parameter matrix of the filter feature of the apparatus to be compensated, determining whether an order of an original transformation matrix is greater than 2M+2N+1; if the order of the original transformation matrix is greater than 2M+2N+1, removing a same number of columns from two ends to obtain the transformation matrix with the order being 2M+2N+1; if the matrix order of the original transformation matrix is less than 2M+2N+1, adding a same number of columns of zeros at two ends to obtain the transformation matrix with the order being 2M+2N+1; and if the order of the original transformation matrix is equal to 2M+2N+1, using the original transformation matrix as the transformation matrix with the order being 2M+2N+1.

In another embodiment, based on step S101 to step S105 in the foregoing embodiment, further, step S104 may specifically include:

taking 2N+1 elements starting from the i th element in the transformation matrix as the i th row of the second parameter matrix, where 0<i<=2M+1, and i is a positive integer. In this way, the second parameter matrix with 2N+1 columns and 2M+1 rows is obtained.

The transformation matrix is transformed into the second parameter matrix, so that the number of columns of the second parameter matrix is equal to the order of the parameter matrix of the compensation filter.

In this embodiment of the present invention, the compensation filter solves a problem of lacking a compensation device in the prior art. A useful signal that is attenuated due to an excess of a rated bandwidth of a device is compensated by using the compensation filter. This ensures normal transmission of a signal.

Figure 2:
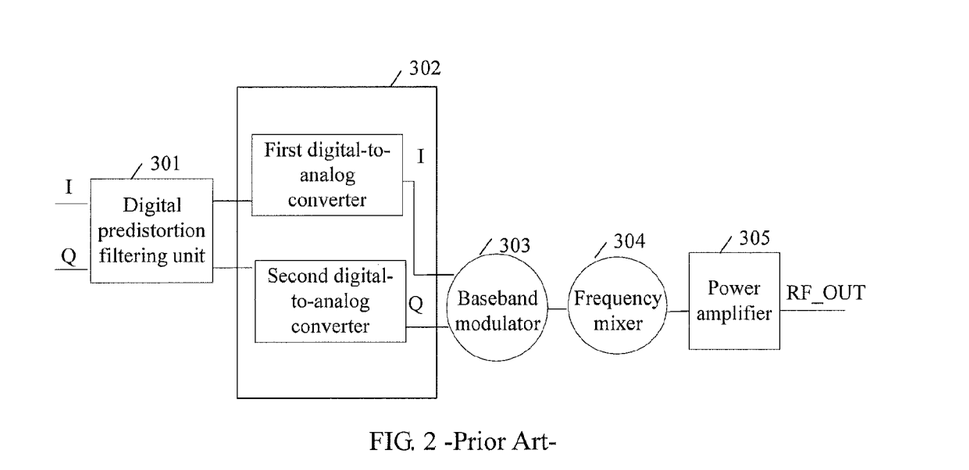
FIG. 2 is a schematic structural diagram of a signal predistortion apparatus in the prior art.

The present invention further provides an embodiment of an apparatus for signal bandwidth compensation. Prior to description of the apparatus for signal bandwidth compensation, it should be noted that: Refer to FIG. 2. FIG. 2 is a schematic structural diagram of a signal predistortion apparatus in the prior art. A power amplifier 305 is incapable of receiving a digital signal. Therefore, a predistortion signal output by a digital predistortion filtering unit 301 needs to be converted by a digital-to-analog conversion unit 302, and then a baseband modulator 303 modulates a baseband signal output by the digital-to-analog conversion unit 302 into an intermediate frequency or radio frequency signal, and is changed by a frequency mixer 304 into a radio frequency signal in a target frequency band and then transmitted to the power amplifier 305. The digital-to-analog conversion unit 302, the baseband modulator 303, and the frequency mixer 304 are assigned with a rated bandwidth. Therefore, a signal exceeding the rated bandwidth is not processed. As a result, a part of signals in the predistortion signals output by the digital predistortion filtering unit 301 are truncated, and the predistortion signals entering the power amplifier 305 are subject to partial signal distortion. Consequently, when the power amplifier 305 performs amplification, the distorted predistortion signal fails to offset non-linearity of the power amplifier 305, thereby forming non-linear residue, which causes interference to a signal in an adjacent channel and also may cause an impact on an in-band signal.

Figure 3:
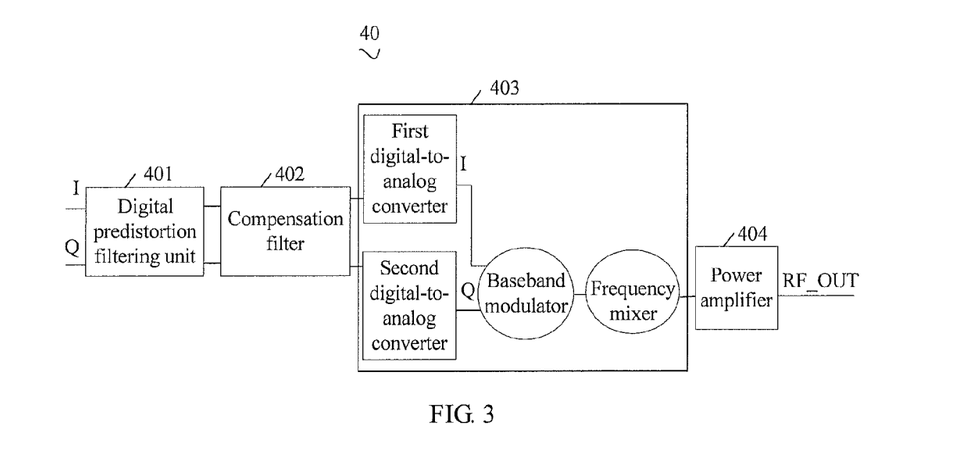
FIG. 3 is a schematic structural diagram of a first embodiment illustrating an apparatus for signal bandwidth compensation according the present invention.

In this embodiment of the present invention, a compensation filter is arranged between the digital predistortion filtering unit 301 and the digital-to-analog conversion unit 302 to compensate for a useful signal that is attenuated due to an excess of a rated bandwidth of a device and ensure normal transmission of a signal. For details, refer to FIG. 3. FIG. 3 is a schematic structural diagram of a first embodiment illustrating an apparatus for signal bandwidth compensation according the present invention. As shown in FIG. 3, an apparatus 40 for signal bandwidth compensation includes: a digital predistortion filtering unit 401, a compensation filter 402, a conversion unit 403, and a power amplifier 404.

The digital predistortion filtering unit 401 receives an original signal, performs predistortion processing on the original signal, and outputs a predistortion signal to the compensation filter 402. The compensation filter 402 receives the predistortion signal from the digital predistortion filtering unit 401, compensates for distortion caused during a process of transmitting the predistortion signal to the power amplifier 404, and outputs a compensated predistortion signal to the conversion unit 403. The conversion unit 403 receives the compensated predistortion signal from the compensation filter 402, converts the compensated predistortion signal into an analog signal, performs frequency mixing processing, and outputs a predistortion signal experiencing the frequency mixing to the power amplifier 404. The power amplifier 404 is configured to receive the predistortion signal experiencing the frequency mixing from the conversion unit 404, amplify the predistortion signal experiencing the frequency mixing, and output an amplified signal.

A parameter of the compensation filter 402 is obtained by using the following formula:

$$w = (x' \cdot x)^{-1} \cdot x' \cdot q;$$

where w is a parameter matrix of the compensation filter, $w = [w_{-N}, w_{-N+1}, \ldots, w_N]^T$, and an order of w is 2N+1; q is a first parameter matrix, $q = [q_{-M}, q_{-M+1}, \ldots, q_M]^T$, and an order of q is 2M+1; the first parameter matrix is a parameter matrix with the least number of columns that is obtained according to a target performance index; x is a second parameter matrix, and $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots & & & \\ x_{M-N}, & x_{M-N+1}, & \ldots, & x_{M+N}, \end{bmatrix};$$

the second parameter matrix is obtained by transformation by a transformation matrix; the transformation matrix is a matrix obtained by performing a convolution operation according to a parameter matrix of a filter feature of a device in the conversion unit, and an order of the transformation matrix is 2M+2N+1; and x' is a conjugate transpose matrix of x.

For theoretical base of the formula $w = q \cdot x' (x \cdot x')^{-1}$ for calculating the parameter of the compensation filter 402, reference may be made to the first embodiment illustrating the method for implementing a compensation filter, which is not described herein any further.

In this embodiment of the present invention, a compensation filter 402 is arranged between a digital predistortion filtering unit 401 and a digital-to-analog conversion unit 402. A useful signal that is attenuated due to an excess of a rated bandwidth of a device is compensated by using the compensation filter 402. This ensures normal transmission of a signal.

Figure 4:
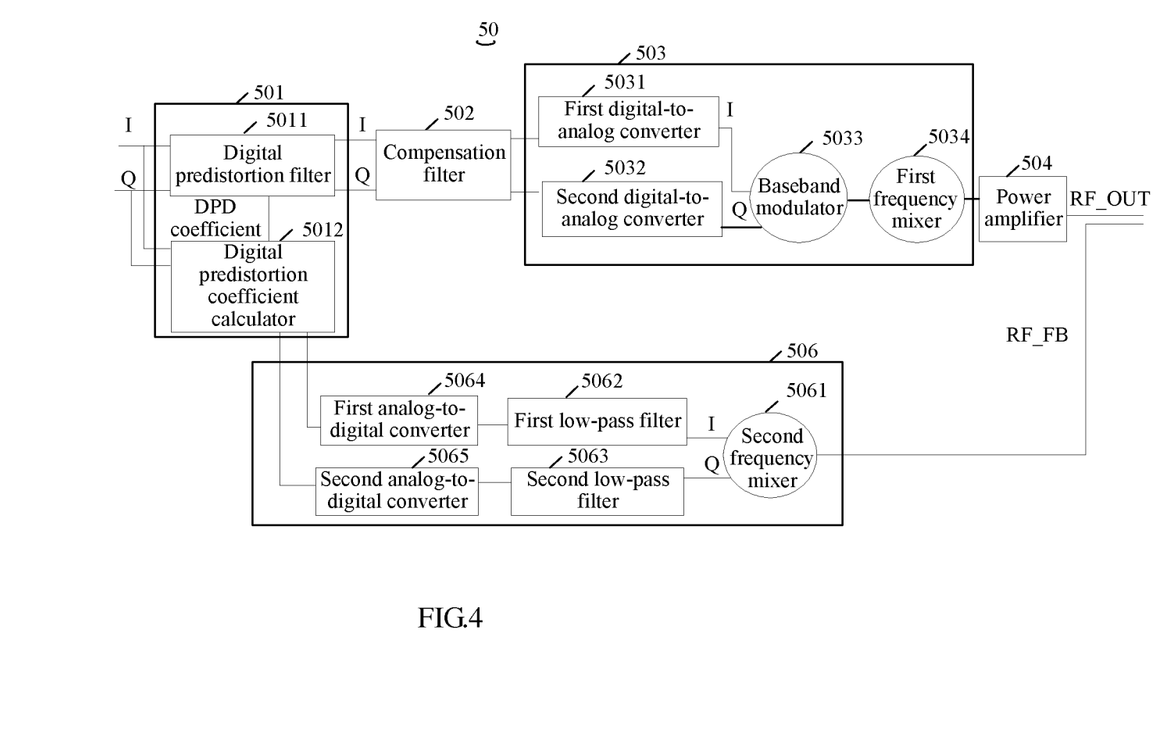
FIG. 4 is a schematic structural diagram of a second embodiment illustrating an apparatus for signal bandwidth compensation according the present invention.

Refer to FIG. 4. FIG. 4 is a schematic structural diagram of a second embodiment illustrating an apparatus for signal bandwidth compensation according the present invention. As shown in FIG. 4, an apparatus 50 for signal bandwidth compensation includes: a digital predistortion filtering unit 501, a compensation filter 502, a conversion unit 503, and a power amplifier 504. The conversion unit 503 includes: a first digital-to-analog converter 5031, a second digital-to-analog converter 5032, a baseband modulator 5033, and a first frequency mixer 5034.

A digital predistortion filtering unit 401 receives an original signal, performs predistortion processing on the original signal, and outputs a predistortion signal to a compensation filter 402. The compensation filter 402 receives the predistortion signal from the digital predistortion filtering unit 401, compensates for distortion caused during a process of transmitting the predistortion signal to a first power amplifier 405, and outputs a predistortion I signal experiencing the compensation and a predistortion Q signal experiencing the compensation to the first digital-to-analog converter 5031 and the second digital-to-analog converter 5032, respectively. The first digital-to-analog converter 5031 converts the predistortion I signal into a predistortion analog I signal, and outputs it to the baseband modulator 5033. The second digital-to-analog converter 5032 converts the predistortion Q signal into a predistortion analog Q signal, and outputs it to the baseband modulator 5033. The baseband modulator 5033 modulates the predistortion analog Q signal and the predistortion analog I signal to generate a channel of predistortion analog signals, and outputs the channel of predistortion analog signals to the first frequency mixer 5034. The first frequency mixer 5034 change frequency of the channel of predistortion analog signals to a target frequency band, obtains predistortion signals experiencing the frequency mixing, and outputs them to the power amplifier 504. The power amplifier 504 receives the predistortion signals experiencing the frequency mixing from the first frequency mixer 5034, amplifies the predistortion signals experiencing the frequency mixing, and outputs amplified signals.

A parameter of the compensation filter 502 is obtained by using the following formula:

$$w = (x' \cdot x)^{-1} \cdot x' \cdot q;$$

where w is a parameter matrix of the compensation filter 502, $w = [w_{-N}, w_{-N+1}, \ldots, w_N]^T$, and an order of w is 2N+1; q is a first parameter matrix, $q = [q_{-M}, q_{-M+1}, \ldots, q_M]^T$, an order of q is 2M+1, and the first parameter matrix is a parameter matrix with the least number of columns that is obtained according to a target performance index. The target performance index may be predefined according to actual needs. In this embodiment of the present invention, the target performance index includes the following: a bandwidth of the predistortion signal experiencing the frequency mixing is greater than or equal to three times a bandwidth of an amplified signal, a signal amplitude fluctuation within a passband of a filter formed by the compensation filter 402 and the conversion unit 403 is less than or equal to 1 dB, and a group delay fluctuation of a filter formed by the compensation filter and the conversion unit is less than or equal to 5 ns. Further, the target performance index may further include the following: a difference between a stopband attenuation of the filter formed by the compensation filter 402 and the conversion unit 403 and a passband attenuation is greater than or equal to 20 dB.

x is a second parameter matrix, where $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots \\ x_{M-N}, & x_{M-N+1}, & \ldots, & x_{M+N}, \end{bmatrix};$$

the i th row of the second parameter matrix is formed by taking 2N+1 elements starting from the i th element in the transformation matrix, 0<i<=2M+1, and i is a positive integer. The transformation matrix is a matrix obtained by performing a convolution operation according to a parameter matrix of a filter feature of a device in the conversion unit 503, and an order of the transformation matrix is 2M+2N+1. It should be noted that: if the order of the matrix that is obtained by performing the convolution operation on the parameter matrix of the filter feature of the device in the conversion unit 503 is greater than 2M+2N+1, a same number of columns are removed from two ends to obtain the transformation matrix with the order being 2M+2N+1; and if the order of the matrix that is obtained by performing the convolution operation on the parameter matrix of the filter feature of the device in the conversion unit 503 is less than 2M+2N+1, a same number of columns of zeros are added at two ends to obtain the transformation matrix with the order being 2M+2N+1. x' is a conjugate transpose matrix of x.

For an origin of the formula $w=q \cdot x'(x \cdot x')^{-1}$ for calculating the parameter of the compensation filter 502, reference may be made to the first embodiment illustrating the method for implementing a compensation filter, which is not described herein any further.

The predistortion filtering unit 501 includes a digital predistortion filter 5011 and a digital predistortion coefficient calculator 5012. The apparatus 50 further includes a feedback unit 506. The feedback unit 506 includes: a second frequency mixer 5061, a first low-pass filter 5062, a second low-pass filter 5063, a first analog-to-digital converter 5064, and a second analog-to-digital converter 5065.

The second frequency mixer 5061 receives an amplified signal from the power amplifier 504, performs frequency division processing on the amplified signal to obtain a channel of analog I signals and a channel of analog Q signals, and outputs the analog I signals and the analog Q signals to the first low-pass filter 5062 and the second low-pass filter 5063, respectively. The first low-pass filter 5062 receives the analog I signals from the second frequency mixer 5061, performs low-pass filtering on the analog I signals to obtain the low-pass filtered analog I signals, and outputs the low-pass filtered analog I signals to the first analog-to-digital converter 5064. The first analog-to-digital converter 5064 receives the low-pass filtered analog I signals, converts the low-pass filtered analog I signals into a digital I signal, and outputs it to the digital predistortion coefficient calculator 5012. The second low-pass filter 5063 receives the analog Q signals from the second frequency mixer 5061, performs low-pass filtering on the analog Q signals to obtain the low-pass filtered analog Q signals, and outputs the low-pass filtered analog Q signals to the second analog-to-digital converter 5065. The second analog-to-digital converter 5065 receives the low-pass filtered analog Q signals, converts the low-pass filtered analog Q signals into a digital Q signal, and outputs it to the digital predistortion coefficient calculator 5012.

In addition to receiving the digital I signal from the first analog-to-digital converter 5064 and the digital Q signal from the second analog-to-digital converter 5065, the digital predistortion coefficient calculator 5012 further receives an original signal, and calculates a predistortion coefficient according to the original signal, the digital Q signal, and the digital I signal, and outputs the predistortion coefficient to the digital predistortion filter 5011. The digital predistortion filter 5011 receives the original signal, performs predistortion processing on the original signal according to the predistortion coefficient, and outputs a predistortion signal to the compensation filter 502.

Certainly, the apparatus 50 may not include a feedback unit 506, a predefined predistortion coefficient is preset in the digital predistortion coefficient calculator 5012, and the digital predistortion coefficient calculator 5012 directly inputs the predefined predistortion coefficient into the digital predistortion filter 5011. Alternatively, the digital predistortion coefficient calculator 5012 is arranged at a receiver end (not shown in a figure), the receiver end calculates a predistortion coefficient according to the received signal and an ideal signal, adds the predistortion coefficient to a service signal, extracts the predistortion coefficient from the service signal by using an extracting module (not shown in a figure), and outputs it to the digital predistortion filter 5011.

In this embodiment of the present invention, a compensation filter 502 is arranged between a digital predistortion filtering unit 501 and a conversion unit 503. A useful signal that is attenuated due to an excess of a rated bandwidth of a device is compensated by using the compensation filter 502. This ensures normal transmission of a signal.

The foregoing descriptions are merely exemplary embodiments of the present invention, but are not intended to limit the protection scope of the present invention. Any replacements in terms of equivalent structure or equivalent procedure made using content of the specification and drawings of the present invention, or any direct or indirect applications in other related technical fields shall all similarly fall within the protection scope of the present invention.

What is claimed is:

1. An apparatus for signal bandwidth compensation, comprising:
    a digital predistortion filtering unit;
    a compensation filter;
    a conversion unit; and
    a power amplifier; wherein
    the digital predistortion filtering unit is configured to receive an original signal, perform predistortion processing on the original signal, and output a predistortion signal to the compensation filter;
    the compensation filter is configured to receive the predistortion signal from the digital predistortion filtering unit, compensate for distortion caused during a process of transmitting the predistortion signal to the power amplifier, and output a compensated predistortion signal to the conversion unit;
    the conversion unit is configured to receive the compensated predistortion signal from the compensation filter, convert the compensated predistortion signal into an analog signal, perform frequency mixing processing, and output a predistortion signal experiencing the frequency mixing to the power amplifier;
    the power amplifier is configured to receive the predistortion signal experiencing the frequency mixing from the conversion unit, amplify the predistortion signal experiencing the frequency mixing, and output an amplified signal;

wherein a parameter of the compensation filter is obtained by using the following formula:

$$w=(x'x)^{-1}\cdot x'\cdot q;$$

wherein, w is a parameter matrix of the compensation filter, $w=[w_{-N}, w_{-N+1}, \ldots, w_N]^T$, and an order of w is 2N+1;

q is a first parameter matrix, $q=[q_{-M}, q_{-M+1}, \ldots, q_M]^T$, an order of q is 2M+1, and the first parameter matrix is a parameter matrix with the least number of columns that is obtained according to a target performance index;

x is a second parameter matrix, $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots \\ x_{M-N}, & x_{M-N+1}, & \ldots, & x_{M+N}, \end{bmatrix};$$

the second parameter matrix is obtained by transformation by a transformation matrix, the transformation matrix is a matrix obtained by performing a convolution operation according to a parameter matrix of a filter feature of a device in the conversion unit, and an order of the transformation matrix is 2M+2N+1; and x' is a conjugate transpose matrix of x.

2. The method according to claim 1, wherein the obtaining the second parameter by transformation by a transformation matrix specifically comprises:

taking 2N+1 elements starting from the i th element in the transformation matrix to form the i th row of the second parameter matrix, wherein 0<i<=2M+1, and i is a positive integer.

3. The method according to claim 1, wherein the obtaining the transformation matrix by performing a convolution operation on a parameter matrix of a filter feature of a device in the conversion unit, and an order of the transformation matrix is 2M+2N+1 specifically comprises:

if the order of the matrix that is obtained by performing the convolution operation on the parameter matrix of the filter feature of the apparatus to be compensated is greater than 2M+2N+1, removing a same number of columns from two ends to obtain the transformation matrix with the order being 2M+2N+1; and if the order of the matrix that is obtained by performing the convolution operation on the parameter matrix of the filter feature of the apparatus to be compensated is less than 2M+2N+1, adding a same number of columns of zeros at two ends to obtain the transformation matrix with the order being 2M+2N+1.

4. The apparatus according to claim 1, wherein the target performance index comprises the following: a bandwidth of the predistortion signal experiencing the frequency mixing is greater than or equal to three times a bandwidth of an amplified signal, a signal amplitude fluctuation within a passband of a filter formed by the compensation filter and the conversion unit is less than or equal to 1 dB, and a group delay fluctuation of a filter formed by the compensation filter and the conversion unit is less than or equal to 5 ns.

5. The apparatus according to claim 4, wherein the target performance index further comprise the following: a difference between a stopband attenuation of the filter formed by the compensation filter and the conversion unit and a passband attenuation is greater than or equal to 20 dB.

6. A method for implementing a compensation filter, comprising:

obtaining a first parameter matrix with the least number of columns according to a target performance index, wherein an order of the first parameter matrix is 2M+1;

determining an order of a parameter matrix of the compensation filter as 2N+1;

performing a convolution operation on a parameter matrix of a filter feature of an apparatus to be compensated, so as to obtain a transformation matrix with an order being 2M+2N+1;

transforming the transformation matrix into a second parameter matrix with 2N+1 columns and 2M+1 rows; and calculating a parameter of the compensation filter by using the following formula:

$$w=(x'x)^{-1}\cdot x'\cdot q;$$

wherein, w denotes the parameter matrix of the compensation filter, and $w=[w_{-N}, w_{-N+1}, \ldots, w_N]^T$;

q denotes the first parameter matrix, and $q=[q_{-M}, q_{-M+1}, \ldots, q_M]^T$;

x denotes the second parameter matrix, and $$x = \begin{bmatrix} x_{-M-N}, & x_{-M-N+1}, & \ldots, & x_{-M+N} \\ x_{-M-N+1}, & x_{-M-N+2}, & \ldots, & x_{-M+N+1}, \\ \ldots \\ x_{M-N}, & x_{M-N+1}, & \ldots, & x_{M+N}, \end{bmatrix};$$

and x' denotes a conjugate transpose matrix of x.

7. The method according to claim 6, wherein the transforming the transformation matrix into a second parameter matrix with 2N+1 columns and 2M+1 rows specifically comprises:

taking 2N+1 elements starting from the i th element in the transformation matrix as the i th row of the second parameter matrix, wherein 0<i<=2M+1, and i is a positive integer.

8. The method according to claim 6, wherein the performing a convolution operation on a parameter matrix of a filter feature of an apparatus to be compensated, so as to obtain a transformation matrix with an order being 2M+2N+1 specifically comprises if the order of the matrix that is obtained by performing the convolution operation on the parameter matrix of the filter feature of the apparatus to be compensated is greater than 2M+2N+1, removing a same number of columns from two ends to obtain the transformation matrix with the order being 2M+2N+1; and if the order of the matrix that is obtained by performing the convolution operation on the parameter matrix of the filter feature of the apparatus to be compensated is less than 2M+2N+1, adding the same number of columns of zeros at two ends to obtain the transformation matrix with the order being 2M+2N+1.

* * * * *

UNITED STATES PATENT AND TRADEMARK OFFICE
CERTIFICATE OF CORRECTION

PATENT NO. : 9,048,795 B2  Page 1 of 1
APPLICATION NO. : 14/198919
DATED : June 2, 2015
INVENTOR(S) : Jun Li et al.

It is certified that error appears in the above-identified patent and that said Letters Patent is hereby corrected as shown below:

In the claims

Claim 1, Column 11, Lines 3-4:

delete "$w=(x'x)^{-1} \cdot x' \cdot q;$" and insert -- $w = (x' \cdot x)^{-1} \cdot x' \cdot q;$ -- therefor.

Signed and Sealed this
Thirteenth Day of October, 2015

Michelle K. Lee
*Director of the United States Patent and Trademark Office*